United States Patent
Lee et al.

(10) Patent No.: US 8,497,535 B2
(45) Date of Patent: Jul. 30, 2013

(54) MULTILAYERED PHOTODIODE AND METHOD OF MANUFACTURING THE SAME

(75) Inventors: Dong-Beom Lee, Yongin-si (KR); Deok-Young Choi, Yongin-si (KR); Dae-Hyun Noh, Yongin-si (KR); Yong-Sung Park, Yongin-si (KR); Won-Kyu Lee, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/224,440

(22) Filed: Sep. 2, 2011

(65) Prior Publication Data
US 2012/0168836 A1    Jul. 5, 2012

(30) Foreign Application Priority Data
Dec. 29, 2010  (KR) .............................. 2010-0137910

(51) Int. Cl.
*H01L 31/0224*    (2006.01)

(52) U.S. Cl.
USPC .......................................... 257/291; 438/237

(58) Field of Classification Search
USPC .................................. 257/291; 438/237, 328
See application file for complete search history.

(56) References Cited

U.S. PATENT DOCUMENTS

| 5,051,570 A * | 9/1991 | Tsujikawa et al. .......... 250/201.1 |
| 6,670,595 B1 * | 12/2003 | Sasaki et al. ............... 250/208.1 |
| 7,737,477 B2 * | 6/2010 | Ha ................................. 257/290 |
| 2008/0067324 A1 * | 3/2008 | Heiler et al. ............... 250/208.1 |
| 2009/0101948 A1 * | 4/2009 | Park et al. ...................... 257/292 |

FOREIGN PATENT DOCUMENTS

| KR | 10-0618820 | 9/2006 |
| KR | 10-0701582 | 3/2007 |
| KR | 10-0736423 | 7/2007 |
| KR | 10-2008-0043698 | 5/2008 |

* cited by examiner

*Primary Examiner* — Thao P. Le
(74) *Attorney, Agent, or Firm* — Robert E. Bushnell, Esq.

(57) ABSTRACT

In a multilayered photodiode and a method of manufacturing the same, the multilayered photodiode comprises: a transparent substrate; a gate insulating film formed on the transparent substrate; a first metal layer formed on the gate insulating film; a semiconductor layer formed on the first metal layer so as to be in contact with the first metal layer; and a second metal layer formed on the semiconductor layer so as to be in contact with the semiconductor layer. The photodiode is vertically multilayered, and has a metal-insulator-metal (MIM) structure in which a P-N region is replaced by a metal, and in which a light-receiving region does not block incident light.

36 Claims, 10 Drawing Sheets

MULTILAYERED PHOTODIODE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Dec. 29, 2010 and there duly assigned Serial No. 10-2010-0137910.

BACKGROUND OF THE INVENTION

1. Field of the Invention

The present invention relates to a multilayered photodiode and a method of manufacturing the same, and more particularly, to a multilayered photodiode which converts incident light into an electrical signal, and a method of manufacturing the multilayered photodiode.

2. Description of the Related Art

A photodiode is a type of photosensor which converts light energy into electrical energy. When light strikes the diode, an electron and a positively charged hole are created, thereby producing current. The voltage of the current is substantially proportional to the intensity of light. Photodiodes have a high response speed, a wide sensitivity wavelength range, and superior photocurrent linearity.

The two commonly used types of photodiodes are PIN diodes and avalanche photodiodes (APDs). A PIN photodiode is a diode with an intrinsic semiconductor layer in the middle of a PN junction. Here, the intrinsic semiconductor layer has high resistance due to low carrier concentration. High speed characteristics of the PIN structure are obtained from a high electric field in the "I" layer rather than the PN junction. On the other hand, an APD includes an avalanche layer in the middle of a PN junction. In the APD, carriers generated by the excitation of incident light collide with atoms within an avalanche layer due to a high electric field, thereby creating hole-electron pairs. As the hole-electron pairs collide with each other, they bring abut an avalanche effect which, in turn, increases photocurrents. APDs based on this principle are used for long-distance telecommunication.

Photodiodes can be used in applications similar to those in which other photodetectors, such as photoconductors, charge-coupled devices (CCDs) and photomultiplier tubes, are used. They can be used in electronic devices such as compact disc players, fire alarms, and the receivers for remote controls in televisions. Furthermore, photodiodes are used for accurate measurement of light intensity in science and industry, and have a better, more linear response than photoconductors. Photodiodes are widely used in various medical applications such as detectors for computerized tomography or instruments to analyze samples.

A conventional photodiode, for example, a PIN photodiode, is a horizontal photodiode having a P-I-N structure in which a P-type doped region and an N-type doped region are situated on left and right sides of an insulating layer (I) which may be made of a silicon material.

In a horizontal photodiode, the amount of current generated from the same amount of received light increases as the distance between a P-type doped region and an N-type doped region increases, that is, as the width of the photodiode increases. In other words, the width of the photodiode should be increased in order to enhance current characteristics thereof. Therefore, horizontal photodiodes are not suitable for use in, for example, image sensor devices which are increasingly being required to become smaller. In addition, it is difficult to improve the performance of a horizontal photodiode while maintaining the width of the photodiode unchanged.

In this regard, a photodiode occupying a small area, but having improved current characteristics, is required.

SUMMARY OF THE INVENTION

The present invention provides a vertically multilayered photodiode.

The present invention also provides a vertically multilayered photodiode having a metal-insulator-metal (MIM) structure in which a P-N region is replaced by a metal, and thus impurity doping is unnecessary.

The present invention also provides a photodiode having an MIM structure, in which a P-N region is replaced by a metal, and including a light-receiving portion formed in a metal layer such that the metal layer in the light-receiving region does not block incident light.

The present invention also provides a photodiode having improved current characteristics as a result of increasing the width of the entire photodiode by patterning a light-receiving portion formed in a metal layer.

However, the present invention is not restricted to the one set forth herein. The above and other aspects of the present invention will become more apparent to one of ordinary skill in the art to which the present invention pertains by referencing the detailed description of the present invention given below.

According to an aspect of the present invention, a multilayered photodiode comprises: a transparent substrate; a gate insulating film formed on the transparent substrate; a first metal layer formed on the gate insulating film; a semiconductor layer formed on the first metal layer so as to be in contact with the first metal layer; and a second metal layer formed on the semiconductor layer so as to be in contact with the semiconductor layer.

According to another aspect of the present invention, a multilayered photodiode comprises: a transparent substrate; a gate insulating film formed on the transparent substrate; a first metal layer formed on the gate insulating film and having an open light-receiving portion to allow light to pass therethrough; a semiconductor layer formed on the first metal layer so as to be in contact with the first metal layer; and a second metal layer formed on the semiconductor layer so as to be in contact with the semiconductor layer.

According to another aspect of the present invention, a method of manufacturing a multilayered photodiode comprises: forming a gate insulating film on a transparent substrate; forming a first metal layer on the gate insulating film; forming a semiconductor layer on the first metal layer so as to be in contact with the first metal layer; and forming a second metal layer on the semiconductor layer so as to be in contact with the semiconductor layer.

According to another aspect of the present invention, a method of manufacturing a multilayered photodiode comprises: forming a gate insulating film on a transparent substrate; providing a first metal layer, which has an open light-receiving portion to allow light to pass therethrough, on the gate insulating film; forming a semiconductor layer on the first metal layer so as to be in contact with the first metal layer; and forming a second metal layer on the semiconductor layer so as to be in contact with the semiconductor layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention should only be defined by the appended claims. In the drawings, sizes and relative sizes of layers and regions may be exaggerated for clarity.

It will be understood that, when an element or layer is referred to as being "on" another element or layer, the element or layer can be directly on another element or layer, or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures.

Embodiments of the invention are described herein with reference to planar and cross-section illustrations which are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes which result, for example, from manufacturing. Thus, the regions illustrated in the figures are schematic in nature, and their shapes are not intended to illustrate the actual shape of a region of a device, and are not intended to limit the scope of the invention.

Hereinafter, exemplary embodiments of the present invention will be described in further detail with reference to the accompanying drawings.

An exemplary embodiment of the present invention will now be described with reference to FIG. 1.

Figure 1:
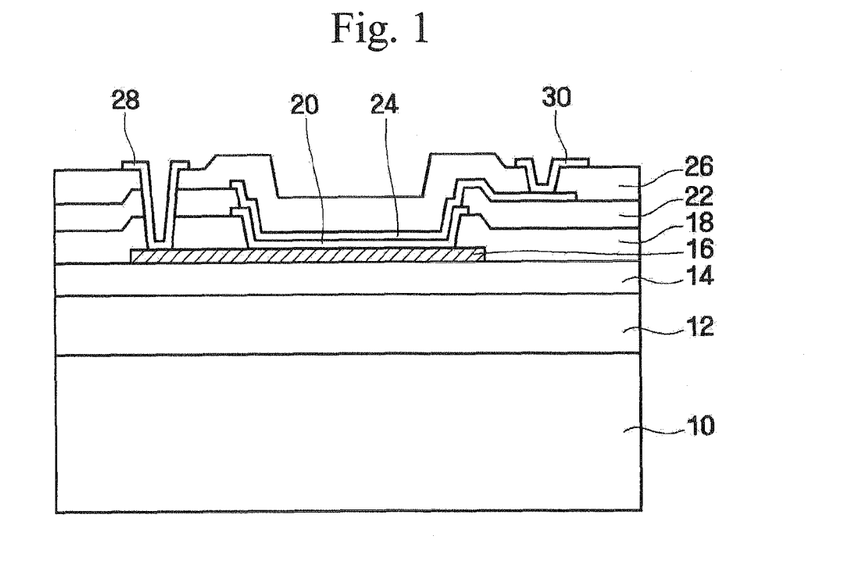
FIG. 1 is a cross-sectional view of a multilayered photodiode according to an exemplary embodiment of the present invention.

FIG. 1 is a cross-sectional view of a multilayered photodiode according to an exemplary embodiment of the present invention.

The multilayered photodiode according to the current exemplary embodiment includes a transparent substrate 10, a gate insulating film 14 formed on the transparent substrate 10, a first metal layer 16 formed on the gate insulating film 14, a semiconductor layer 20 formed on the first metal layer 16 so as to be in contact with the first metal layer 16, and a second metal layer 24 formed on the semiconductor layer 20 so as to be in contact with the semiconductor layer 20.

The transparent substrate 10 may be made of a transparent glass material containing $SiO_2$ as a main component. However, the material which forms the transparent substrate 10 is not limited to the transparent glass material. The transparent substrate 10 may also be made of a transparent plastic material which may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

A buffer layer 12 may further be formed on the transparent substrate 10 so as to planarize the transparent substrate 10 and prevent penetration of impurities into the transparent substrate 10. The buffer layer 12 may be a single layer of silicon oxide ($SiO_x$), silicon nitride ($SiN_x$) or silicon oxynitride ($SiO_2N_x$), or a multilayer of these materials.

The gate insulating film 14 is disposed on the transparent substrate 10 or the buffer layer 12. Like the buffer layer 12, the gate insulating film 14 may be a single layer of $SiO_2$, $SiN_x$ or $SiO_2N_x$, or a multilayer of these materials. The gate insulating film 14 may be made of the same material as the buffer layer 12 or of a material different from that of the buffer layer 12.

The first metal layer 16 is disposed on the gate insulating film 14, the semiconductor layer 20 is disposed on the first metal layer 16, and the second metal layer 24 is disposed on the semiconductor layer 20. That is, the multilayered photodiode according to the current exemplary embodiment has a metal-insulator-metal (MIM) structure in which the first metal layer 16, the semiconductor layer 20, and the second metal layer 24 are stacked sequentially.

The first metal layer 16 corresponds to a P-type (or N-type) doped region in a PIN photodiode. Contrary to the first metal layer 16, the second metal layer 24 corresponds to an N-type (or P-type) doped region. The semiconductor layer 20 interposed between the first metal layer 16 and the second metal layer 24 serves as an insulating layer. When receiving light of sufficient photon energy, the semiconductor layer 20 generates electrons and/or holes, thereby producing current which flows between the first metal layer 16 and the second metal layer 20.

The metal layer 16 may be a single layer of aluminum (Al) or an Al alloy, such as an aluminum-neodymium (Al—Nd) alloy, or a multilayer of a chrome (Cr) or molybdenum (Mo) alloy and an Al alloy stacked on the Cr or Mo alloy.

The semiconductor layer 20 may be made of silicon (Si), i.e., amorphous silicon (a-Si). Alternatively, the semiconductor layer 20 may be made of polycrystalline silicon (p-Si) so as to supply a required amount of current. Otherwise, the semiconductor layer 20 may be made of, but is not limited to, Ge, GaP, GaAs, or AlAs. The semiconductor layer 20 may be a silicon semiconductor layer formed by lightly diffusing n-type impurities of a silicon-on-insulator (SOI) substrate.

The second metal layer 24 may be made of a material selected from Mo, Cr, W, Al—Nd, Ti, MoW, and Al.

A plurality of interlayer insulating films 18, 22 may be formed between the first metal layer 16 and the second metal layer 24.

As described above, in the multilayered photodiode according to the current exemplary embodiment, the first metal layer 16, the semiconductor layer 20, and the second metal layer 24 are stacked vertically, and current generated by the semiconductor layer 20 from incident light may flow between the first metal layer 16 and the second metal layer 24.

An end of the first metal layer 16 is connected to a first electrode 28 by a contact hole, and is thus electrically connected to an external device, and an end of the second metal layer 24 is connected to a second electrode 30 by a contact hole, and thus is electrically connected to the external device. The first and second electrodes 24 and 30, respectively, may be made of one or more transparent conductive materials selected from indium tin oxide (ITO), indium zinc oxide (IZO), carbon nanotubes, a conductive polymer, and nanowires. That is, the first and second electrodes 28 and 30, respectively, may be made of one of, or a mixture of two or more of, the transparent conductive materials.

As described above, a vertically multilayered photodiode according to the current exemplary embodiment can be provided. In particular, a vertically multilayered photodiode having an MIM structure, in which a P-N region is replaced by a metal and thus impurity doping is unnecessary, can be provided.

Hereinafter, other exemplary embodiments of the present invention will be described with reference to FIGS. 2 thru 7.

FIGS. 2 thru 7 are views showing multilayered photodiodes according to other exemplary embodiments of the present invention and various pattern shapes of a light-receiving portion formed in a first metal layer of each of the multilayered photodiodes.

Figure 2:
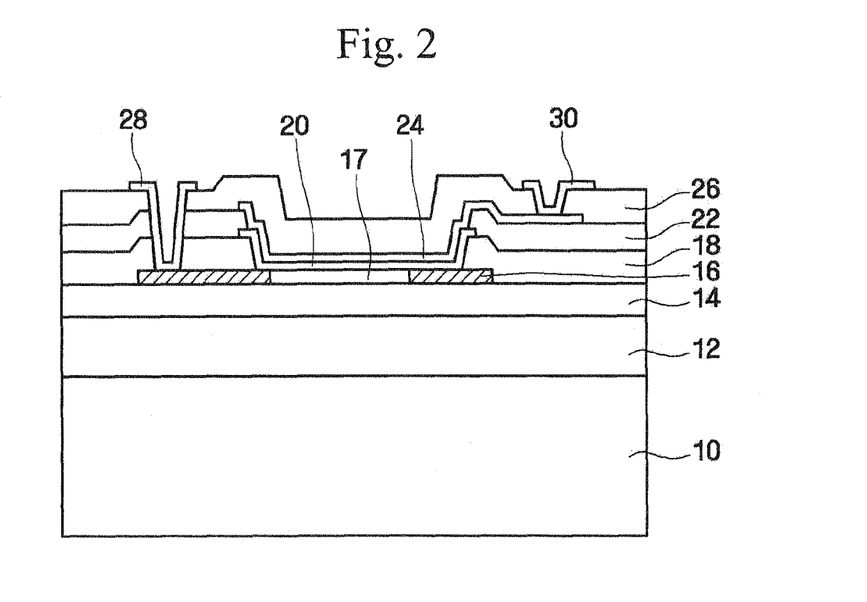
FIGS. 2 thru 7 are views showing multilayered photodiodes according to other exemplary embodiments of the present invention and various pattern shapes of a light-receiving portion formed in a first metal layer of each of the multilayered photodiodes.
Figure 3:
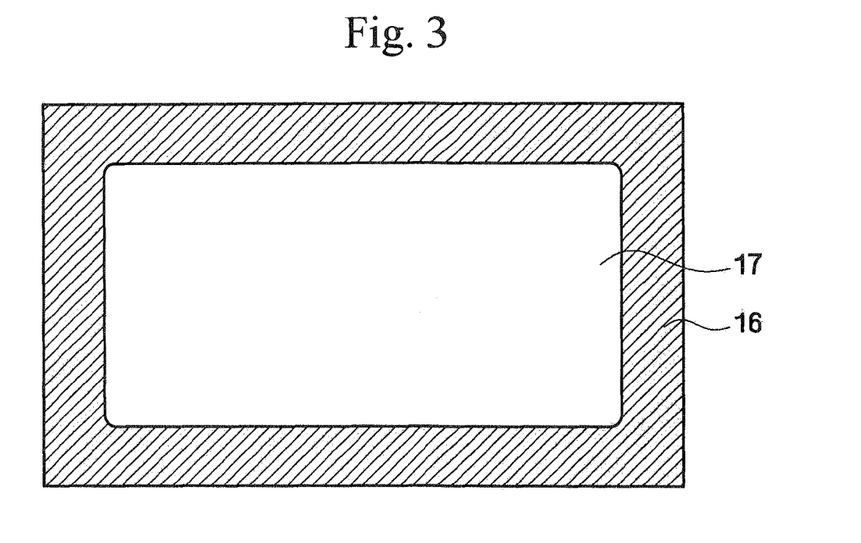
Figure 4:
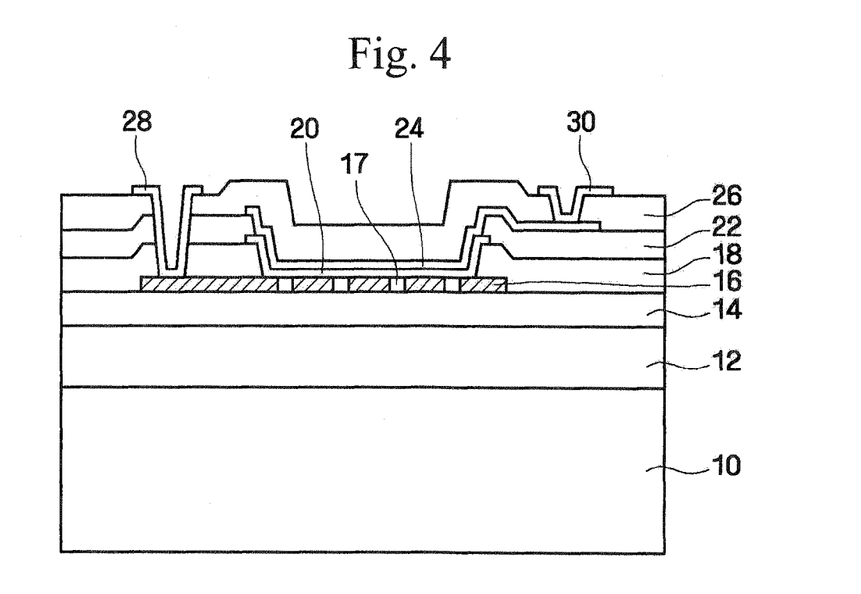
Figure 5:
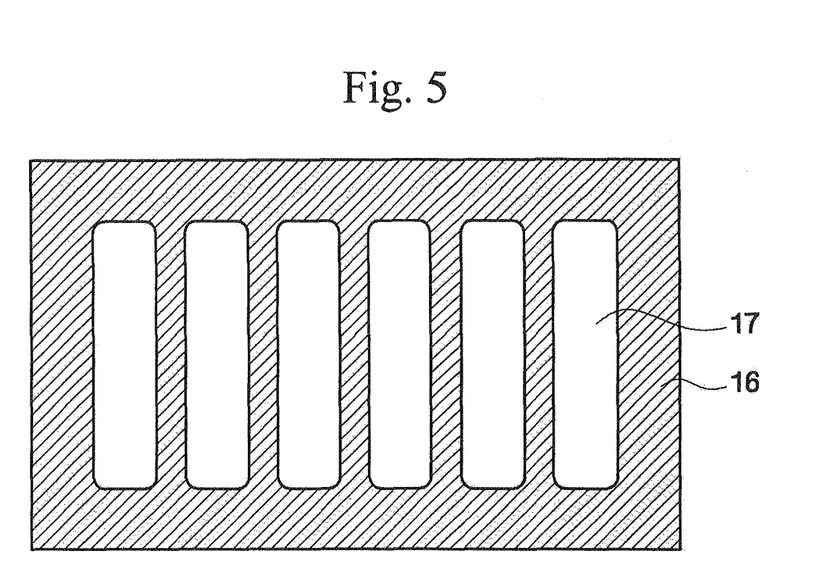
Figure 6:
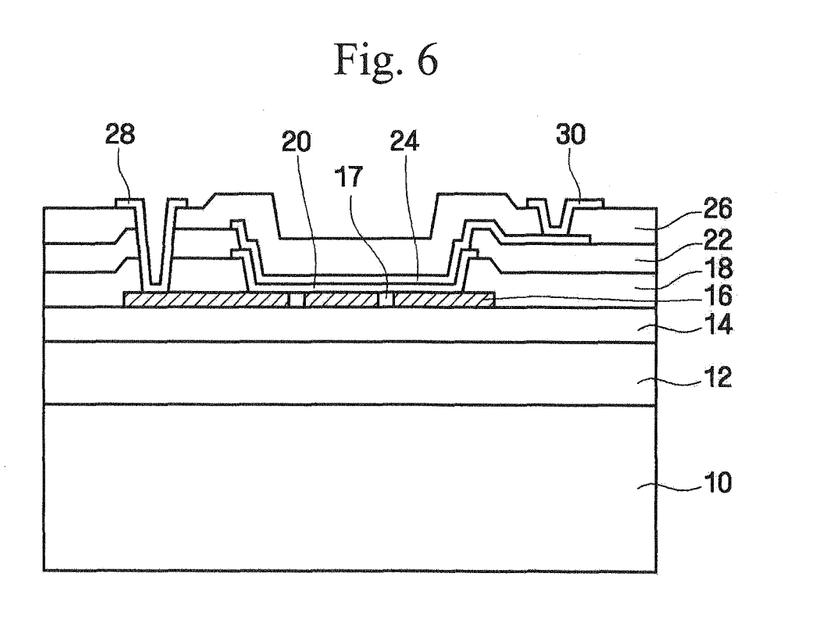
Figure 7:
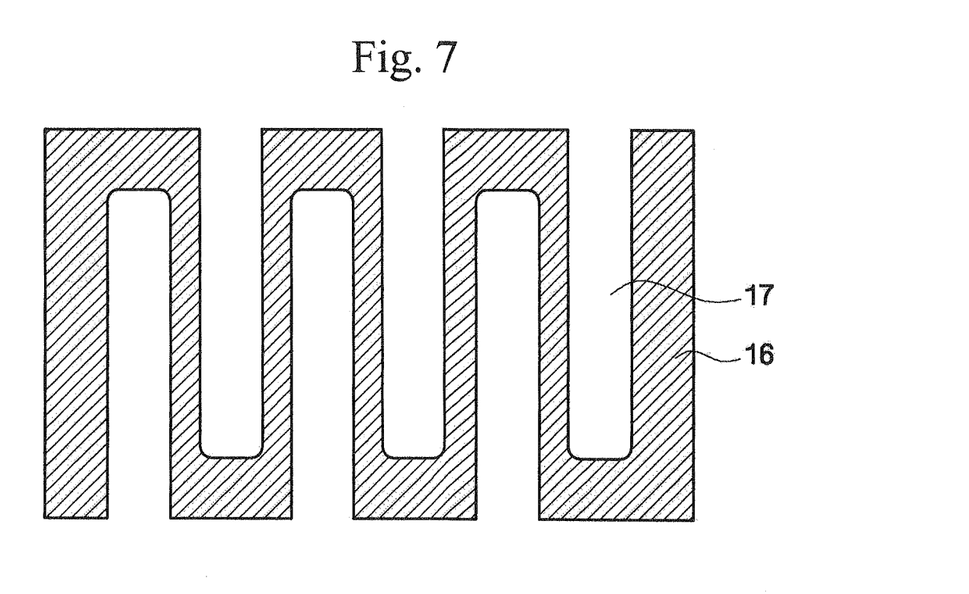

More specifically, FIG. 2 is a cross-sectional view of a multilayered photodiode according to another exemplary embodiment of the present invention, FIG. 3 is a view showing a first pattern shape of a light-receiving portion 17 formed in a first metal layer 16 of the multilayered photodiode of FIG. 2, FIG. 4 is a cross-sectional view of a multilayered photodiode according to another exemplary embodiment of the present invention, FIG. 5 is a view showing a second pattern shape of a light-receiving portion 17 formed in a first metal layer 16 of the multilayered photodiode of FIG. 4, FIG. 6 is a cross-sectional view of a multilayered photodiode according to another exemplary embodiment of the present invention, and FIG. 7 is a view showing a third pattern shape of a light-receiving portion 17 formed in a first metal layer 16 of the multilayered photodiode of FIG. 6.

The multilayered photodiodes according to the current exemplary embodiments includes a transparent substrate 10, a gate insulating film 14 formed on the transparent substrate 10, a first metal layer 16 having an open light-receiving portion 17 to pass light therethrough, a semiconductor layer 20 formed on the first metal layer 16 so as to be in contact with the first metal layer 16, and a second metal layer 24 formed on the semiconductor layer 20 so as to be in contact with the semiconductor layer 20.

Elements of the current exemplary embodiments are identical to those of the previous exemplary embodiment, and thus a repetitive description thereof will be omitted. However, the current exemplary embodiments are different from the previous exemplary embodiment in that the first metal layer 16 of the current exemplary embodiments includes the light-receiving portion 17 which is open so as to allow incident light to reach the semiconductor layer 20 in a more efficient manner.

FIGS. 3, 5 and 7 are plan views of the first metal layer 16 having various patterns. The light-receiving portion 17, which is open so as to allow light to pass therethrough, is formed in the center of the first metal layer 16. The light-receiving portion 17 may be rectangular as shown in FIG. 3, or it may be provided in a plurality of portions as shown in FIG. 5. In FIG. 5, a plurality of light-receiving portions 17 formed in the first metal layer 16 have the same shape. However, the present invention is not limited thereto, and a plurality of light-receiving portions 17 having different shapes may also be formed in the first metal layer 16. In addition, while the light-receiving portions 17 are arranged at regular intervals in FIG. 5, they may also be arranged at irregular intervals. As shown in FIG. 7, the first metal layer 16 may be shaped like a single band disposed on a plane in a zigzag pattern, with alternate turns in opposite directions.

The multilayered photodiodes, each including the first metal layer 16 which has the light-receiving portion 17 of various shapes, are illustrated in FIGS. 2, 4 and 6, respectively. When the first metal layer 16 is formed of an opaque metal layer, light incident on the transparent substrate 10 may be lost by failing to reach the semiconductor layer 20 situated on the first metal layer 16. To prevent this problem, the first metal layer 16 may be patterned so as to have an open region, i.e., the light-receiving portion 17. Accordingly, light incident on the transparent substrate 10 may pass through the light-receiving portion 17 so as to reach the semiconductor layer 20. When sufficient light energy is delivered to the semiconductor layer 20, the semiconductor layer 20 may generate electrons and/or holes, thereby producing sufficient current.

Referring to FIG. 4, the first metal layer 16 shown in FIG. 5 is disposed on the gate insulating film 14, and the semiconductor layer 20 is disposed on the first metal layer 16. In the first metal layer 16, a plurality of patterns is formed in a horizontal direction (in FIG. 5). The patterns are separated from each other, and are individually in contact with the semiconductor layer 20 to form subphotodiodes. As the number of subphotodiodes in the same area increases, the width value of the entire multilayered photodiode increases, thereby improving current characteristics of the multilayered photodiode. The same improvement in the current characteristics of the multilayered photodiode can also be achieved by the first metal layer 17 shown in FIG. 7. It is obvious to those of ordinary skill in the art that the first metal layer 16 shown in the drawings can be replaced by any metal layer patterned into a shape which can bring about substantially the same effect.

As described above, a multilayered photodiode having an MIM structure, in which a P-N region is replaced by a metal, includes a light-receiving portion formed in a first metal layer such that the first metal layer in a light-receiving region does not block incident light. Accordingly, the light transmittance of the first metal layer can be increased. In addition, since the width of the entire multilayered photodiode is increased by patterning the first metal layer or the light-receiving portion formed in the first metal layer, current characteristics of the multilayered photodiode can be improved.

Hereinafter, a method of manufacturing a multilayered photodiode according to an exemplary embodiment of the present invention will be described with reference to FIGS. 8 and 10 thru 19.

Figure 8:
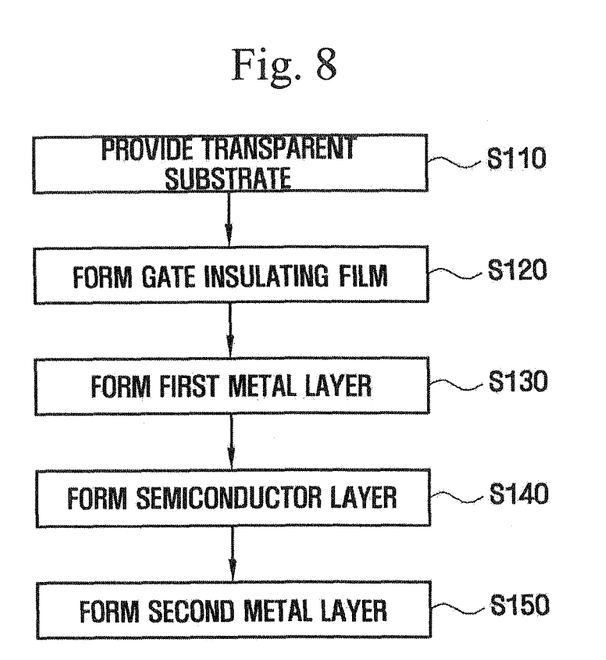
FIG. 8 is a flowchart illustrating a method of manufacturing a multilayered photodiode according to an exemplary embodiment of the present invention.
Figure 9:
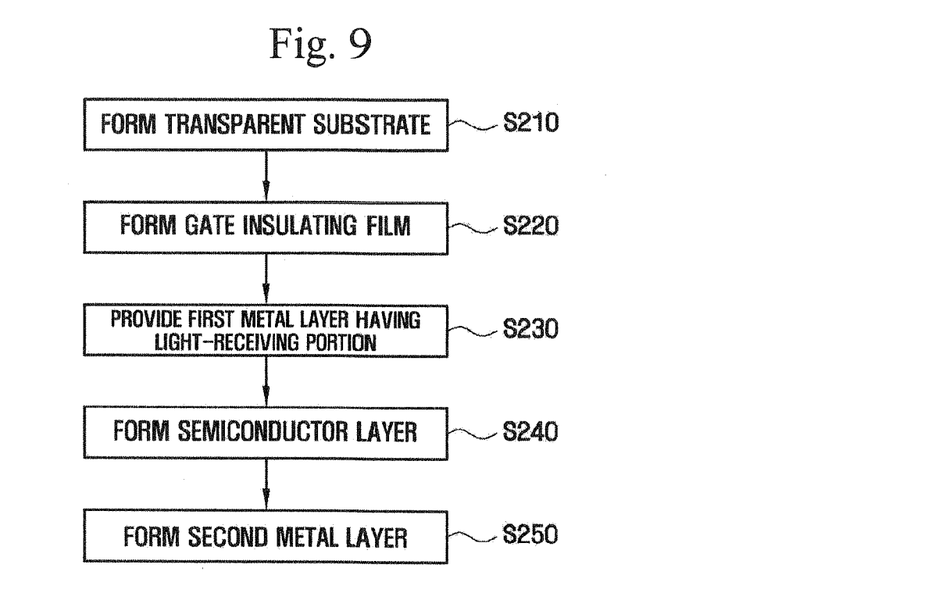
FIG. 9 is a flowchart illustrating a method of manufacturing a multilayered photodiode according to another exemplary embodiment of the present invention.

FIG. 8 is a flowchart illustrating a method of manufacturing a multilayered photodiode according to an exemplary embodiment of the present invention, FIG. 9 is a flowchart illustrating a method of manufacturing a multilayered photodiode according to another exemplary embodiment of the present invention, and FIGS. 10 thru 19 are cross-sectional views schematically illustrating the method of manufacturing a multilayered photodiode according to the exemplary embodiment of FIG. 8.

In FIGS. 10 thru 19, manufacturing processes common to the method of manufacturing a multilayered photodiode according to the current exemplary embodiment of FIG. 8 and a method of manufacturing a multilayered photodiode according to another exemplary embodiment of FIG. 9 are illustrated. For simplicity, the manufacturing processes will be described once in the current exemplary embodiment.

Referring to FIG. 8, the method of manufacturing a multilayered photodiode according to the current exemplary embodiment includes providing a transparent substrate (operation S110), forming a gate insulating film on the transparent substrate (operation S120), forming a first metal layer on the gate insulating film (operation S130), forming a semiconductor layer on the first metal layer so as to be in contact with the first metal layer (operation S140), and forming a second metal layer on the semiconductor layer so as to be in contact with the semiconductor layer (operation S150).

Figure 10:
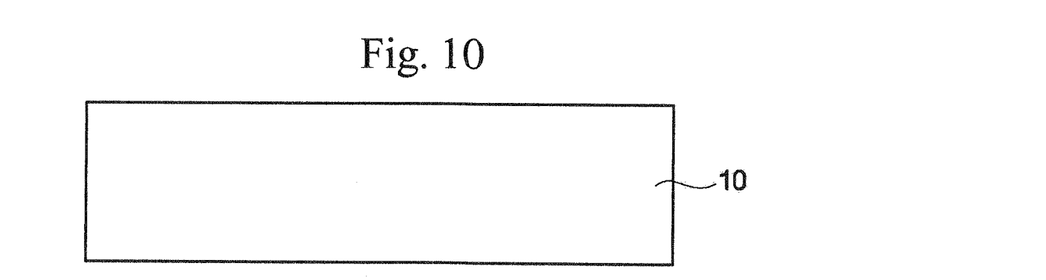
FIGS. 10 thru 19 are cross-sectional views schematically illustrating the methods of manufacturing a multilayered photodiode according to the exemplary embodiments of FIGS. 8 and 9.

Referring to FIGS. 8 and 10, a transparent substrate 10 is provided (operation S110). As described above, the transparent substrate 10 may be made of a transparent glass material containing $SiO_2$ as a main component. However, the material which forms the transparent substrate 10 is not limited to the transparent glass material. The transparent substrate 10 may also be made of a transparent plastic material which may be an insulating organic material selected from the group consisting of PES, PAR, PEI, PEN, PET, PPS, polyallylate, polyimide, polycarbonate, TAC, and CAP.

Figure 11:
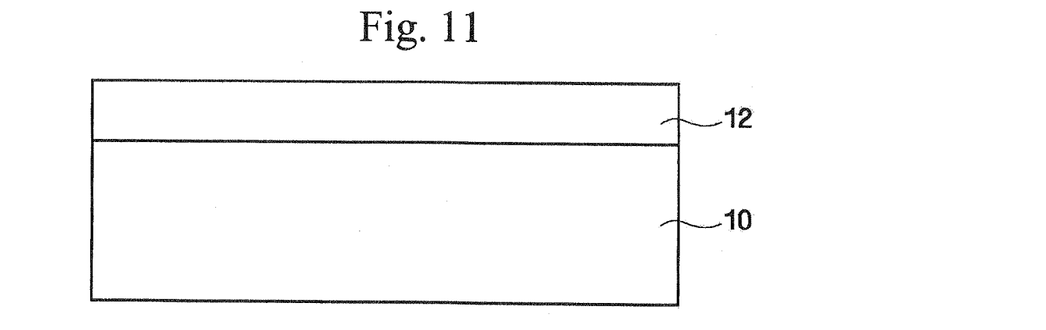

Referring to FIG. 11, a buffer layer 12 may be formed on the transparent substrate 10 so as to planarize the transparent substrate 10 and prevent penetration of impurities into the transparent substrate 10. The buffer layer 12 may be a single layer of $SiO_x$, $SiN_x$ or $SiO_2N_x$, or a multilayer of these materials. When necessary, the formation of the buffer layer 12 may be omitted.

Figure 12:
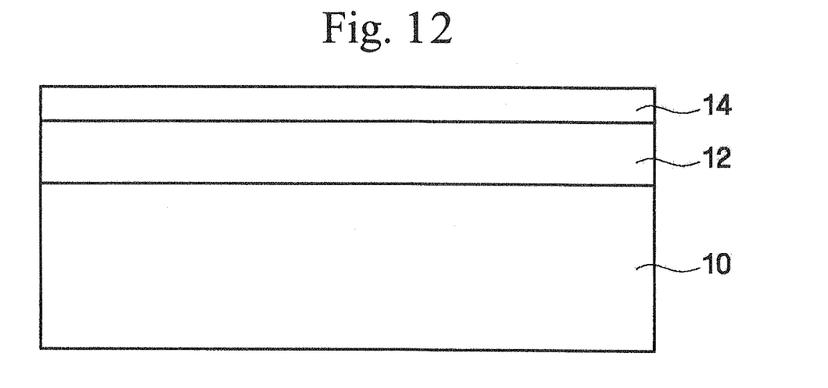

Referring to FIGS. 8 and 12, a gate insulating film 14 is formed on the buffer layer 12 (or on the transparent substrate 10) (operation S120). Like the buffer layer 12, the gate insulating film 14 may be a single layer of $SiO_2$, $SiN_x$ or $SiO_2N_x$, or a multilayer of these materials. The gate insulating film 14 may be made of the same material as the buffer layer 12 or of a material different from that of the buffer layer 12.

Figure 13:
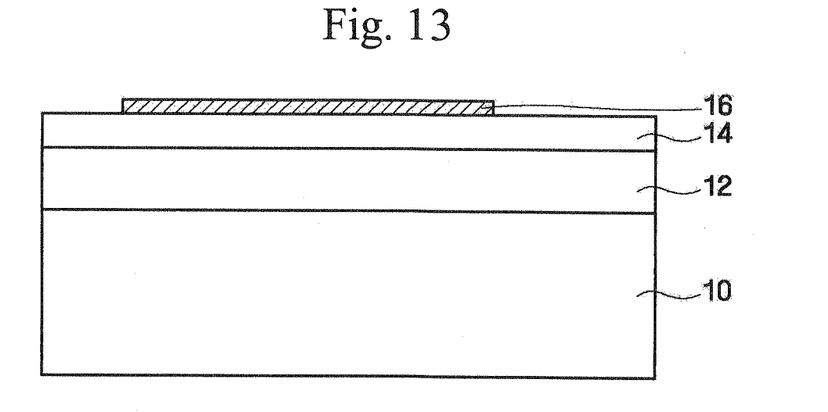

Referring to FIGS. 8 and 13, a first metal layer 16 is formed on the gate insulating film 14 (operation S130). The first metal layer 16 corresponds to a P-type (or N-type) doped region in a PIN photodiode. The metal layer 16 may be a single layer of Al or an Al alloy, such as an Al—Nd alloy, or a multilayer of a Cr or Mo alloy and an Al alloy stacked on the Cr or Mo alloy. As shown in the drawing, the first metal layer 16 occupies a smaller area of the transparent substrate 10 than the underlying elements.

Figure 14:
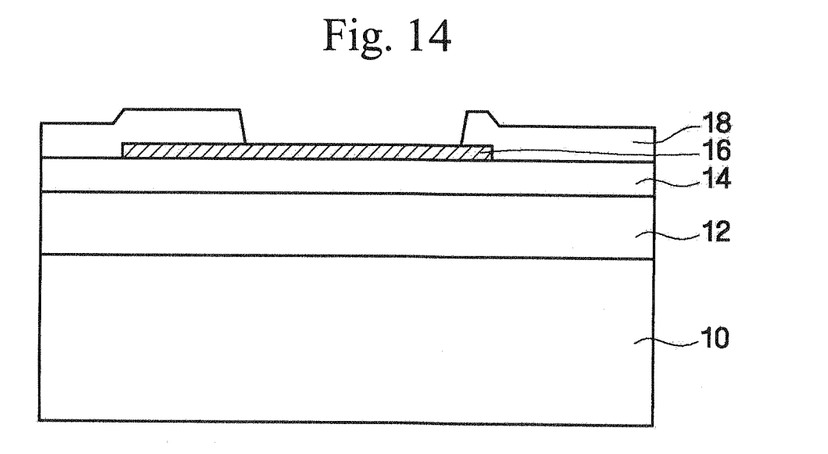

Referring to FIG. 14, a first interlayer insulating film 18 is formed on the first metal layer 16 and the gate insulating film 14, and is patterned so as to expose the first metal layer 16. Like the gate insulating film 14, the first interlayer insulating film 18 may be a single layer of $SiO_2$, $SiN_x$ or $SiO_2N_x$ or a multilayer of these materials.

Figure 15:
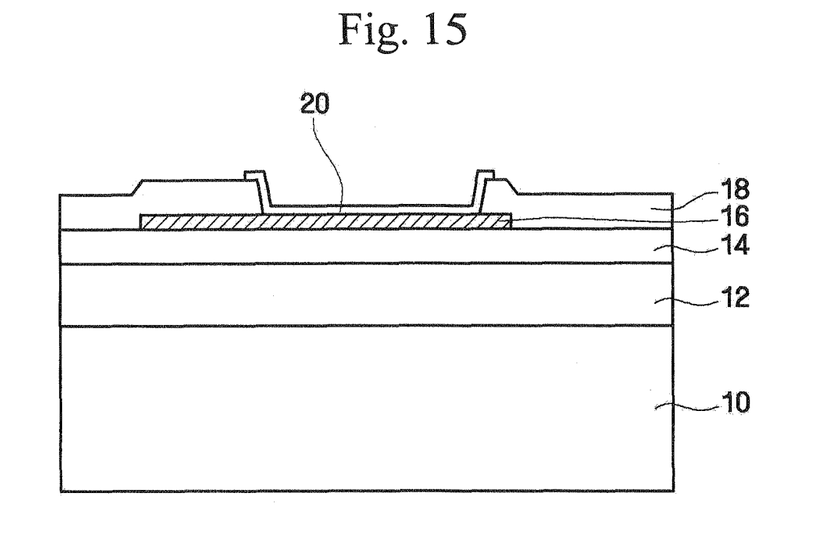

Referring to FIGS. 8 and 15, a semiconductor layer 20 is formed on the first interlayer insulating film 18 (operation S140). As described above, the semiconductor layer 20 may be made of Si (i.e., a-Si). Alternatively, the semiconductor layer 20 may be made of p-Si to supply a required amount of current. Otherwise, the semiconductor layer 20 may be made of, but is not limited to, Ge, GaP, GaAs, or AlAs. The semiconductor layer 20 may be a silicon semiconductor layer formed by lightly diffusing n-type impurities of an SOI substrate. As shown in FIG. 15, the semiconductor layer 20 may occupy a smaller area of the substrate 10 than the first metal layer 16.

Figure 16:
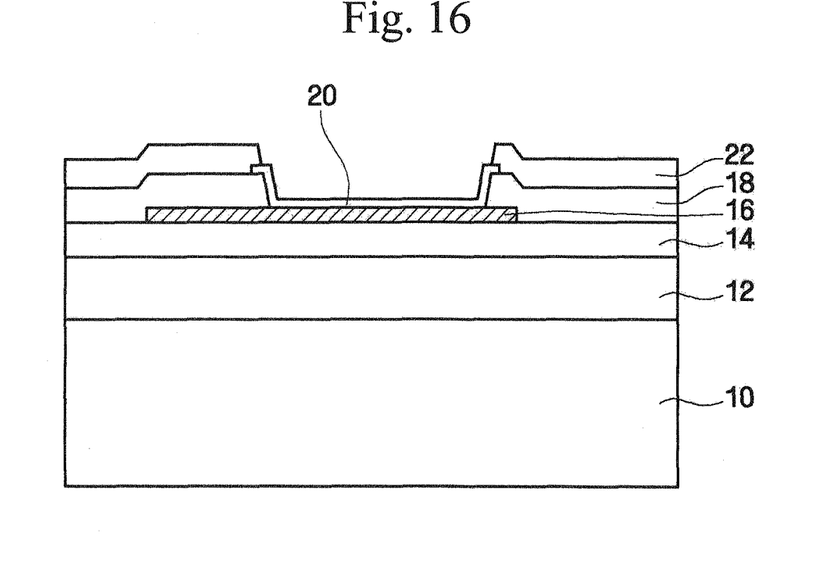

Referring to FIG. 16, a second interlayer insulting film 22 is formed on the first interlayer insulating film 18 and the semiconductor layer 20, and is patterned so as to expose the semiconductor layer 20. Like the first interlayer insulating film 18, the second interlayer insulating film 22 may be a single layer of $SiO_2$, $SiN_x$ or $SiO_2N_x$ or a multilayer of these materials.

Figure 17:
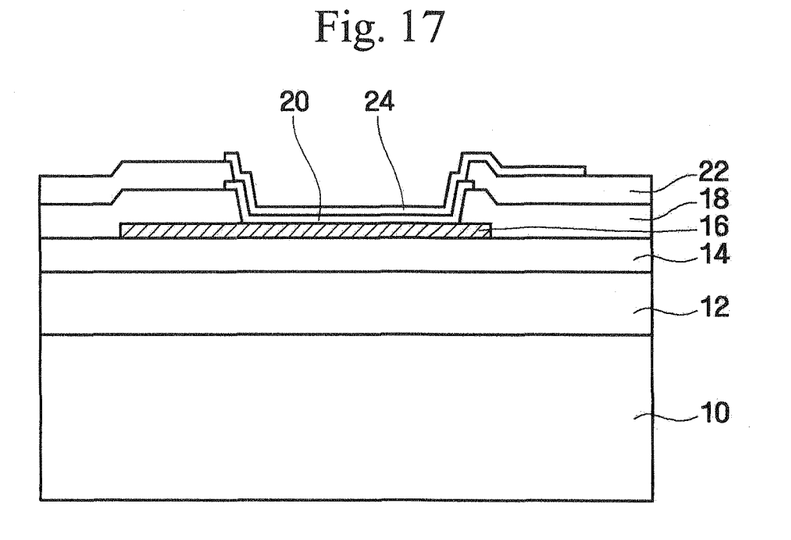

Referring to FIGS. 8 and 17, a second metal layer 24 is formed on the semiconductor layer 20 and part of the second interlayer insulating film 22 (operation S150). Contrary to the first metal layer 16, the second metal layer 24 corresponds to an N-type (or P-type) doped region in a PIN photodiode. The second metal layer 24 may be made of any one material selected from Mo, Cr, W, Al—Nd, Ti, MoW, and Al.

Figure 18:
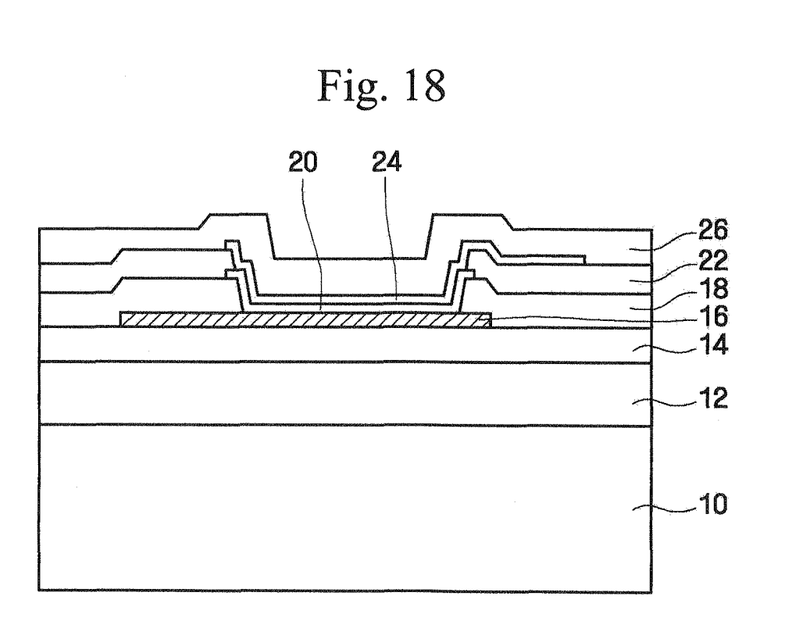

Referring to FIG. 18, a third interlayer insulating film 26 is formed on the second metal layer 24 and the second interlayer insulating film 22 so as to conceal and protect the internal elements. The third interlayer insulating film 26 may be made of the same material as the first and second interlayer insulating films 18 and 22, respectively.

Figure 19:
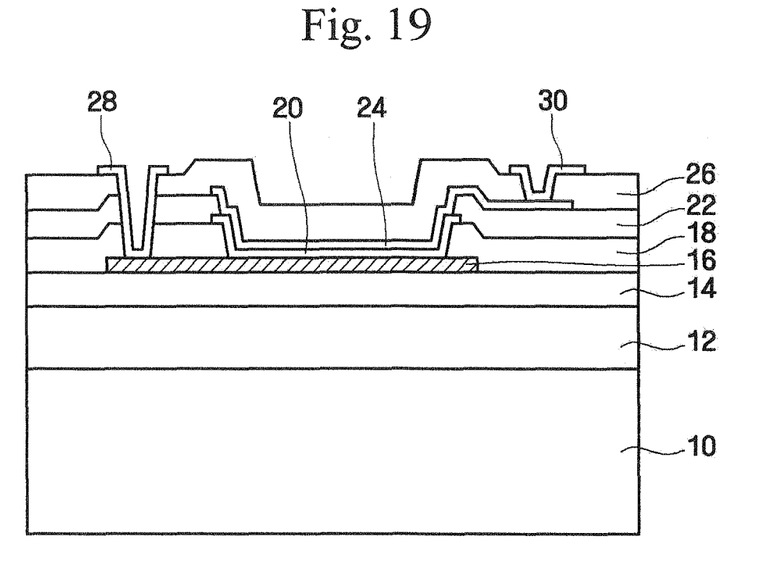

Referring to FIG. 19, a contact hole is formed so as to penetrate from a top surface of the third interlayer insulating film 26 to the first metal layer 16, and a first electrode 28 is deposited in the contact hole. Therefore, current generated from received light flows to an external destination via the first and second electrodes 28 and 30, respectively.

Hereinafter, a method of manufacturing a multilayered photodiode according to another exemplary embodiment of the present invention will be described with reference to FIG. 9. The method of manufacturing a multilayered photodiode according to the current exemplary embodiment includes forming a transparent substrate (operation S210), forming a gate insulating film on a transparent substrate (operation S220), forming a first metal layer on the gate insulating film (operation S230), forming a semiconductor layer on the first metal layer so as to be in contact with the first metal layer (operation S240), and forming a second metal layer on the semiconductor layer so as to be in contact with the semiconductor layer (operation S250).

The manufacturing method according to the current exemplary embodiment is the same as the manufacturing method according to the previous exemplary embodiment, except that it further includes a process of forming a light-receiving portion 17 (see FIGS. 2, 4 and 6) in a first metal layer 16. Various shapes of the light-receiving portion 17 and various patterns of the first metal layer 16 are as described above, and thus a repetitive description thereof will be omitted.

In the manufacturing method according to the current exemplary embodiment, the first metal layer 16 having the light-receiving portion 17 formed in advance may be provided. Alternatively, a mask may be formed on a gate insulating film 14 in the shape of the light-receiving portion 17, and the first metal layer 16 may be deposited on regions of the gate insulating film 14 other than a region in which the mask is formed, thereby forming the light-receiving portion 17. This method is only an example, and the present invention is not limited to this example.

As described above, in a multilayered photodiode having an MIM structure in which a P-N region is replaced by a metal, a light-receiving portion is formed in a first metal layer such that the first metal layer in a light-receiving region does not block incident light. Accordingly, the light transmittance of the first metal layer can be increased. In addition, since the width of the entire multilayered photodiode is increased by patterning the first metal layer or the light-receiving portion formed in the first metal layer, current characteristics of the multilayered photodiode can be improved.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only, and not for purposes of limitation.

What is claimed is:

1. A multilayered photodiode, comprising:
   a transparent substrate; and
   an MIM photodiode formed on the transparent substrate;
   the MIM photodiode including a first metal layer, a semiconductor layer formed on the first metal layer and in contact with the first metal layer, and a second metal layer formed on the semiconductor layer and in contact with the semiconductor layer.

2. The photodiode of claim 1, further comprising a gate insulating film formed on the transparent substrate and a buffer layer disposed between the transparent substrate and the gate insulating film.

3. The photodiode of claim 1, a plurality of interlayer insulating films being formed between the first metal layer and the second metal layer.

4. The photodiode of claim 1, further comprising a first electrode electrically connected to the first metal layer.

5. The photodiode of claim 4, the first electrode being made of a transparent conductive material.

6. The photodiode of claim 5, the transparent conductive material comprising at least one of indium tin oxide, indium zinc oxide, carbon nanotubes, a conductive polymer, and nanowires.

7. The photodiode of claim 4, further comprising a second electrode electrically connected to the second metal layer.

8. The photodiode of claim 7, the second electrode being made of a transparent conductive material.

9. The photodiode of claim 8, the transparent conductive material comprising at least one of indium tin oxide, indium zinc oxide, carbon nanotubes, a conductive polymer, and nanowires.

10. The photodiode of claim 1, the first metal layer containing at least one of aluminum, neodymium, chrome, and molybdenum.

11. The photodiode of claim 1, the second metal layer containing at least one of molybdenum, chrome, tungsten, aluminum-neodymium, titanium, molybdenum tungsten, and aluminum.

12. The photodiode of claim 1, the semiconductor layer being made of a material containing one of polycrystalline silicon and amorphous silicon.

13. A multilayered photodiode, comprising:
   a transparent substrate;
   a gate insulating film formed on the transparent substrate;
   a first metal layer formed on the gate insulating film and having an open light-receiving portion for allowing light to pass therethrough;
   a semiconductor layer formed on the first metal layer and in contact with the first metal layer; and
   a second metal layer formed on the semiconductor layer and in contact with the semiconductor layer.

14. The photodiode of claim 13, the light-receiving portion being rectangular.

15. The photodiode of claim 13, the light-receiving portion of the first metal layer being formed in a plurality of portions.

16. The photodiode of claim 15, the portions of the light-receiving portion having a same shape.

17. The photodiode of claim 15, the portions of the light-receiving portion being arranged at regular intervals.

18. The photodiode of claim 13, the first metal layer being shaped as a single band and being disposed in a zigzag pattern on a top surface of the gate insulating film.

19. A method of manufacturing a multilayered photodiode, the method comprising the steps of:
   forming a gate insulating film on a transparent substrate;
   forming a first metal layer on the gate insulating film;
   forming a semiconductor layer on the first metal layer and in contact with the first metal layer; and
   forming a second metal layer on the semiconductor layer and in contact with the semiconductor layer.

20. The method of claim 19, further comprising the step of forming a buffer layer between the transparent substrate and the gate insulating film.

21. The method of claim 19, further comprising the step of forming a plurality of interlayer insulating films between the first metal layer and the second metal layer.

22. The method of claim 19, further comprising the step of forming a first electrode electrically connected to the first metal layer.

23. The method of claim 22, further comprising the step of forming a second electrode electrically connected to the second metal layer.

24. The method of claim 23, the first and second electrodes being made of a transparent conductive material.

25. The method of claim 24, the transparent conductive material comprising at least one of indium tin oxide, indium zinc oxide, carbon nanotubes, a conductive polymer, and nanowires.

26. The method of claim 22, the first electrode being made of a transparent conductive material.

27. The method of claim 26, the transparent conductive material comprising at least one of indium tin oxide, indium zinc oxide, carbon nanotubes, a conductive polymer, and nanowires.

28. The method of claim 19, the first metal layer containing at least one of aluminum, neodymium, chrome, and molybdenum.

29. The method of claim 19, the second metal layer containing at least one of molybdenum, chrome, tungsten, aluminum-neodymium, titanium, molybdenum tungsten, and aluminum.

30. The method of claim 19, the semiconductor layer being made of one of polycrystalline silicon and amorphous silicon.

31. A method of manufacturing a multilayered photodiode, the method comprising the steps of:
   forming a gate insulating film on a transparent substrate;
   providing a first metal layer, which has an open light-receiving portion for allowing light to pass therethrough, on the gate insulating film;
   forming a semiconductor layer on the first metal layer and in contact with the first metal layer; and
   forming a second metal layer on the semiconductor layer and in contact with the semiconductor layer.

32. The method of claim 31, the light-receiving portion being rectangular.

33. The method of claim 31, the light-receiving portion of the first metal layer being formed in a plurality of portions.

34. The method of claim 33, the portions of the light-receiving portion having a same shape.

35. The method of claim 33, the portions of the light-receiving portion being arranged at regular intervals.

36. The method of claim 31, the first metal layer being shaped as a single band and being disposed in a zigzag pattern on a top surface of the gate insulating film.

* * * * *